United States Patent
Chung et al.

(10) Patent No.: US 10,284,112 B2
(45) Date of Patent: May 7, 2019

(54) CIRCUIT ARRANGEMENT FOR USE IN A POWER CONVERSION STAGE AND A METHOD OF CONTROLLING A POWER CONVERSION STAGE

(71) Applicant: City University of Hong Kong, Kowloon (HK)

(72) Inventors: Shu Hung Henry Chung, Mid-levels (HK); Kewei Wang, Beijing (CN)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 15/590,142

(22) Filed: May 9, 2017

(65) Prior Publication Data
US 2018/0331633 A1    Nov. 15, 2018

(51) Int. Cl.
| | | |
|---|---|---|
| H02M 7/5387 | (2007.01) | |
| H02M 3/155 | (2006.01) | |
| H02M 1/12 | (2006.01) | |
| H03K 17/16 | (2006.01) | |

(52) U.S. Cl.
CPC .......... *H02M 7/5387* (2013.01); *H02M 1/12* (2013.01); *H02M 3/155* (2013.01); *H03K 17/163* (2013.01)

(58) Field of Classification Search
CPC . H02M 1/08; H02M 7/5387; H02M 7/538466
See application file for complete search history.

(56) References Cited

U.S. PATENT DOCUMENTS

| | | | |
|---|---|---|---|
| 2,953,738 A | 6/1954 | Bright | |
| 5,510,972 A | 4/1996 | Wong | |
| 6,411,535 B1* | 6/2002 | Roux | H02M 1/4225 363/124 |
| 6,430,071 B1 | 8/2002 | Haneda | |
| 7,737,650 B2 | 6/2010 | Sardat | |
| 2007/0058402 A1* | 3/2007 | Shekhawat | H02M 1/42 363/89 |
| 2008/0224625 A1* | 9/2008 | Greenfeld | H05B 33/0818 315/201 |

(Continued)

OTHER PUBLICATIONS

X. Li and Y. F. Li, "An optimized phase-shift modulation for fast transient response in a dual-active-bridge converter," IEEE Transactions on Power Electronics, vol. 29, No. 6, pp. 2661-2665, 2014.

(Continued)

*Primary Examiner* — Yemane Mehari
*Assistant Examiner* — Bart Iliya
(74) *Attorney, Agent, or Firm* — Renner Kenner Greive Bobak Taylor & Weber

(57) ABSTRACT

A circuit arrangement for use in a power conversion stage and a method of controlling a power conversion stage includes at least two electronic devices connected in series, the at least two electronic devices including at least one active power electronic device operable in a plurality of operation states including an active linearly operated state; wherein the at least one active power electronic device is arranged to be controlled and to operate in the plurality of operation states in each of a plurality conversion cycles, such that a generation of electric harmonics in the power conversion stage is suppressed during an operation of the power conversion stage.

22 Claims, 8 Drawing Sheets

(56) References Cited

U.S. PATENT DOCUMENTS

| | | | | |
|---|---|---|---|---|
| 2010/0188876 A1* | 7/2010 | Garrity | ............... | H02M 1/4225 |
| | | | | 363/127 |
| 2011/0080760 A1 | 4/2011 | Lu | | |
| 2011/0149622 A1* | 6/2011 | Lin | ..................... | H02M 1/4208 |
| | | | | 363/124 |
| 2012/0243275 A1* | 9/2012 | Lin | ..................... | H02M 1/4208 |
| | | | | 363/89 |
| 2014/0347103 A1* | 11/2014 | Snook | ................ | H03K 17/0828 |
| | | | | 327/109 |

OTHER PUBLICATIONS

B. Zhao, Q. Song, W. Liu, and Y. Zhao, "Transient dc bias and current impact effects of high-frequency-isolated bidirectional dc-dc converter in practice," IEEE Transactions on Power Electronics, vol. 31, No. 4, pp. 3203-3216, 2016.

K. Takagi and H. Fujita, "Dynamic control and performance of an isolated dual-active-bridge dc-dc converter," in 2015 9th International Conference on Power Electronics and ECCE Asia (ICPE-ECCE Asia). IEEE, pp. 1521-1527, 2015.

K. Takagi and H. Fujita, "Dynamic control and dead-time compensation method of an isolated dual-active-bridge dc-dc converter," in 2015 17th European Conference on Power Electronics and Applications (EPE'15 ECCE-Europe), IEEE, pp. 1-10, 2015.

* cited by examiner

CIRCUIT ARRANGEMENT FOR USE IN A POWER CONVERSION STAGE AND A METHOD OF CONTROLLING A POWER CONVERSION STAGE

TECHNICAL FIELD

The present invention relates to a circuit arrangement for use in a power conversion stage and a method of controlling a power conversion stage, although not exclusively, to an active current control to a series-connected power device in a power conversion stage.

BACKGROUND

Electronic or electrical apparatuses usually operate with predetermined electrical ratings, such as a desired current and/or voltage profile. In general, power converters may be included in an apparatus to convert or regulate an electrical power supplied form an electrical source to the required current and/or voltage. This may include a conversion of AC to DC, a step-up or step-down DC voltage conversion, etc.

Typically, it is required that electric line filters should be included in a primary power conversion stage for smoothing the electrical signal transmitted to and from the electric power source. In some conversion requirement, the line filters may include large inductors and capacitors for handling relatively significant noise and harmonic distortion generated during the operation of the power converters.

SUMMARY OF THE INVENTION

In accordance with a first aspect of the present invention, there is provided a circuit arrangement for use in a power conversion stage, comprising at least two electronic devices connected in series, the at least two electronic devices includes at least one active power electronic device operable in a plurality of operation states; wherein the at least one active power electronic device is arranged to be controlled and to operate in the plurality of operation states in each of a plurality conversion cycles, such that a generation of electric harmonics in the power conversion stage is suppressed during an operation of the power conversion stage.

In an embodiment of the first aspect, the plurality of operation states includes an on state, an off state and an active state.

In an embodiment of the first aspect, the active power electronic device is arranged to exhibit a resistive characteristic when operating in the active state.

In an embodiment of the first aspect, the at least one active power electronic device is further arranged to operate in either the on state, off state or the active state during the operation of the power conversion stage.

In an embodiment of the first aspect, the circuit arrangement further comprises a controller arranged to control the at least one active power electronic device to operate in the plurality of operation states.

In an embodiment of the first aspect, the at least one active power electronic device is arranged to be controlled by the controller with a feedback mechanism.

In an embodiment of the first aspect, the feedback mechanism includes an error amplifier arranged to detect an error signal in the power conversion stage with respect to a referenced signal and generates control signal to minimize the error.

In an embodiment of the first aspect, the controller is arranged to regulate an input current of the power conversion stage.

In an embodiment of the first aspect, the controller is arranged to regulate the input current with reference to a current reference signal and the input current sensed by a current sensor.

In an embodiment of the first aspect, the controller is arranged to regulate the voltage drop on the at least one active power electronic device with reference to a voltage reference signal and the voltage drop on the at least one active power electronic device sensed by a voltage sensor.

In an embodiment of the first aspect, the controller is arranged to obtain the input current and/or the input voltage and to regulate the input current and/or the input voltage.

In an embodiment of the first aspect, the controller includes an analogue controller.

In an embodiment of the first aspect, the active power electronic device includes a transistor.

In an embodiment of the first aspect, the controller is arranged to program a gate terminal of the transistor such that the transistor operates in the plurality of operation states.

In an embodiment of the first aspect, the transistor is arranged to operate in a forward polarity and/or a reversed polarity.

In an embodiment of the first aspect, the power conversion stage includes a rectifier circuit arrangement.

In an embodiment of the first aspect, the power conversion stage includes a boost converter.

In accordance with a second aspect of the present invention, there is provided a method of controlling a power conversion stage, comprising the step of controlling at least one active power electronic device to operate in a plurality of operation states in each of a plurality conversion cycles, such that a generation of electric harmonics in the power conversion stage is suppressed during an operation of the power conversion stage; wherein the power conversion stage includes at least two electronic devices connected in series and the at least two electronic devices includes the at least one active power electronic device.

In an embodiment of the second aspect, the plurality of operation states includes an on state, an off state and an active state.

In an embodiment of the second aspect, the active power electronic device is arranged to exhibit a resistive characteristic when operating in the active state.

In an embodiment of the second aspect, the at least one active power electronic device is further arranged to operate in either the on state or the active state during the operation of the power conversion stage.

In an embodiment of the second aspect, the method further comprises the step of: detecting an error signal of the power conversion stage with respect to a referenced signal; and regulating an input current and/or a voltage drop of the at least one power electronic device based on the detected error signal.

In an embodiment of the second aspect, the active power electronic device includes a transistor.

In an embodiment of the second aspect, the power conversion stage includes a rectifier circuit arrangement.

In an embodiment of the second aspect, the power conversion stage includes a boost converter.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that series-connected power electronic devices may be used in power electronics setups as commutating or switching unit. They can be found in the half-bridge or full-bridge structures. In one example, a single phase diode bridge rectifier may be made of a full bridge consisting of four uncontrollable power semiconductor devices such as diodes, with their on/off states determined by the biasing conditions. As the input AC voltage polarity alters, the bridge commutates and maintains DC output.

In another example, the switching component in a buck converter is a diode series-connected to a transistor, which is also a half bridge structure. The half bridge structure chops input voltage at high frequency to step it down. The transistor is actively controlled while the diode is not. Alternatively, the diode may be replaced by another active transistor to reduce power loss.

Figure 1B:
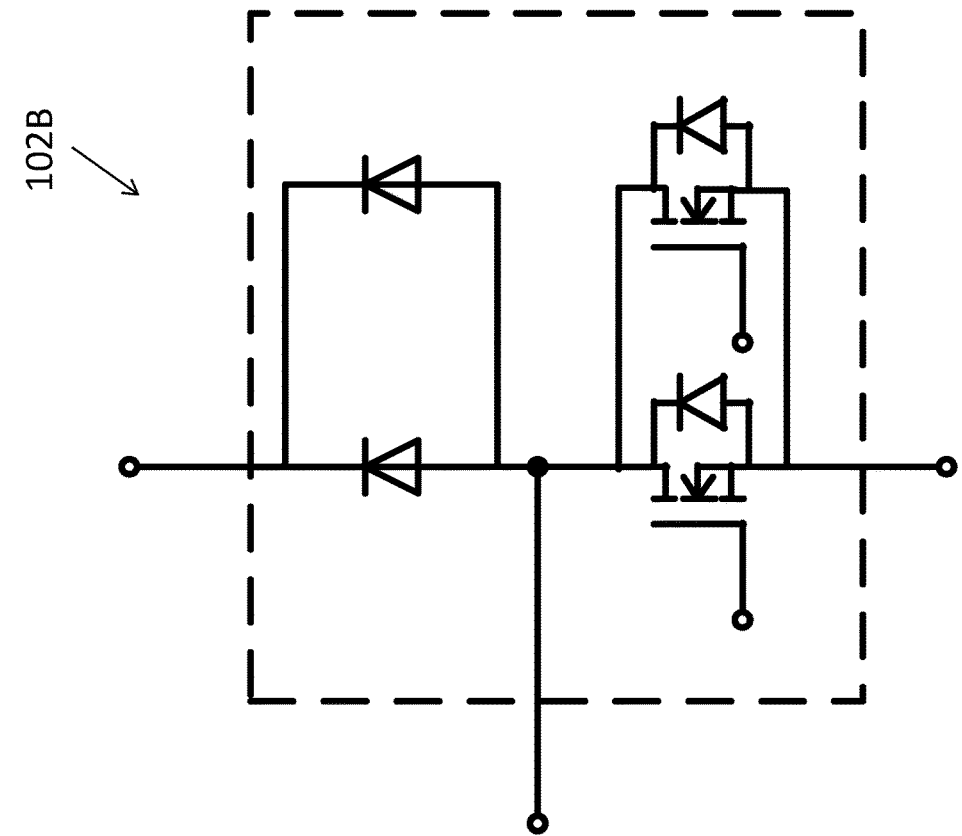
FIG. 1B is a schematic diagram showing an example series-connected power device modified from the example of FIG. 1A.
Figure 1A:
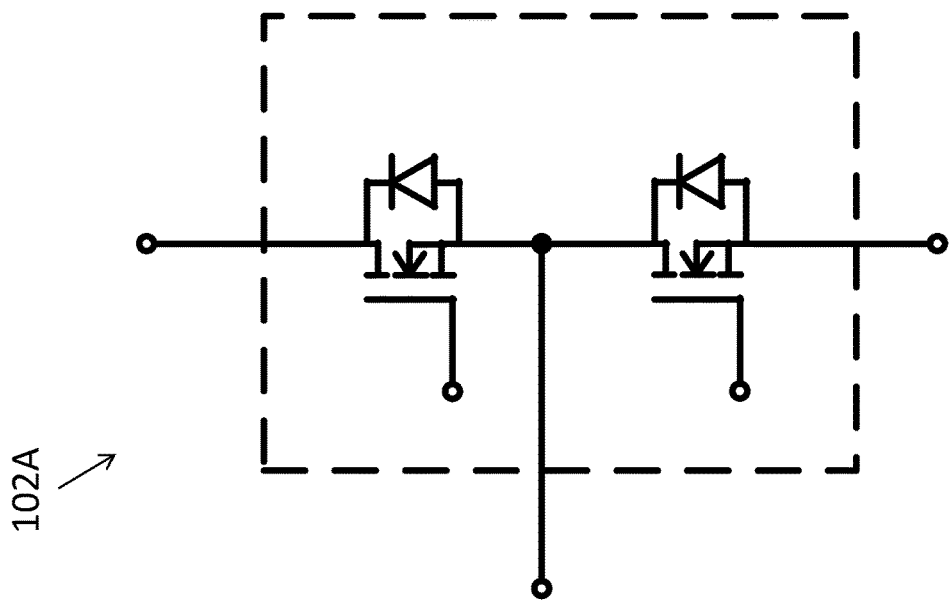
FIG. 1A is a schematic diagram showing an example series-connected power device.

With reference to FIG. 1A, there is shown an example of a series-connected power electronic device 102A. As appreciated by a person skilled in the art, any power electronic devices or semiconductor devices other than MOSFETs, devices such as diodes, transistors and thyristors may be applicable to have such configuration. The connection or polarity of single semiconductor device may also vary. Referring to FIG. 1B, to increase the current handling capability of semiconductor device, paralleling of identical devices may be included in the series-connected power device 102B.

Figure 2:
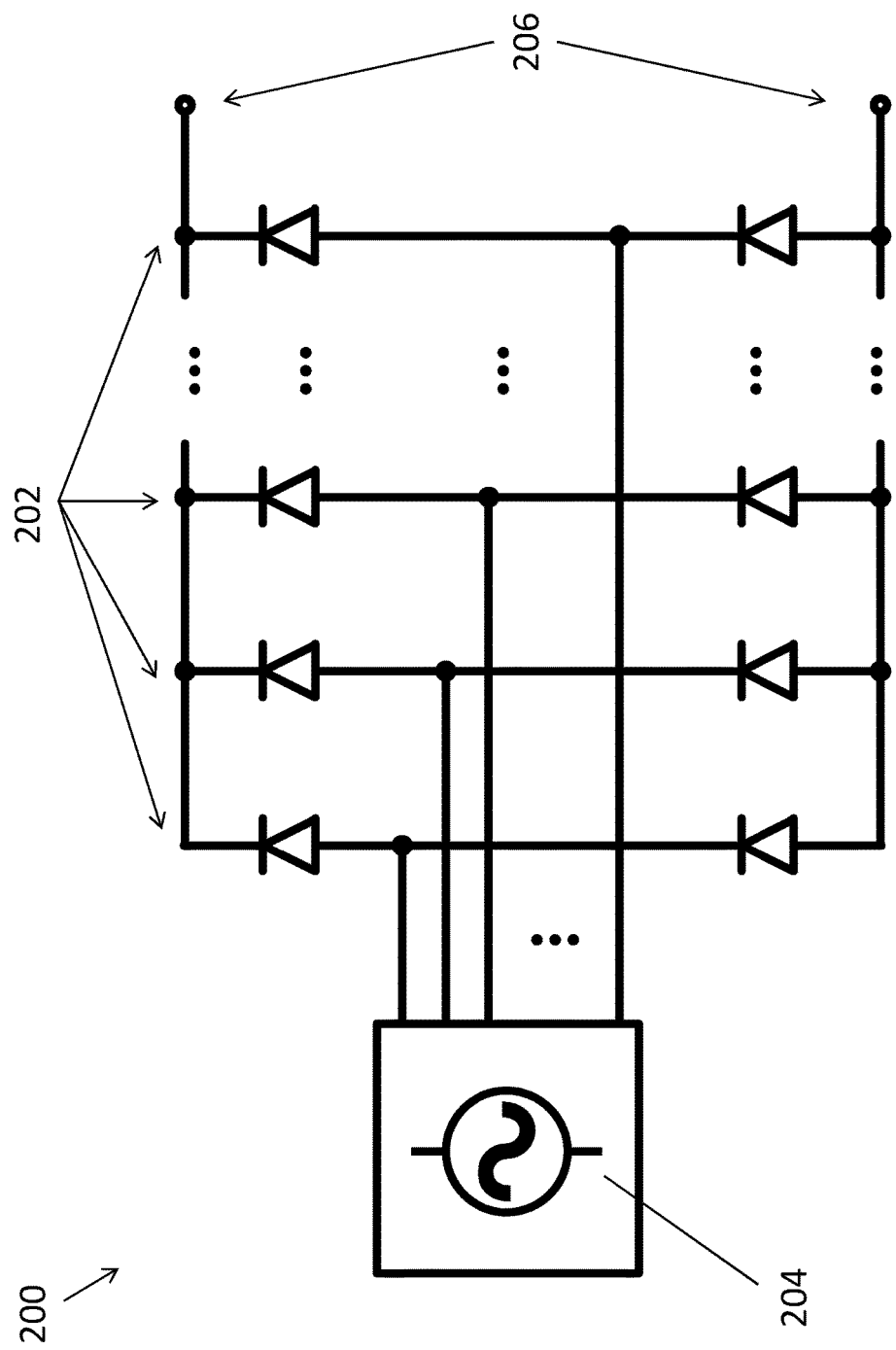
FIG. 2 is a schematic diagram showing a plurality of series-connected power device used in a rectifier circuit.

With reference to FIG. 2, a bridge rectifier 200 (an AC-DC commutating device) may include several half bridges 202. The AC source 204 connects to the mid-point (the conjunction) of each half bridge. The DC output terminals 206 are the two common rails of the parallel half bridges.

When the diodes conduct they have nearly constant voltage drop of 1~2 Volts, which leads to significant power loss. Alternatively, diodes can be replaced by MOSFETs to reduce the power loss. A rectifier diode may also be replaced with a bipolar junction transistor. In these examples, the power devices are designed to operate either fully on or fully off.

In a switching converter, power semiconductor devices are switched at a high frequency to chop the input energy, and deliver it to the output through a filter. Switching converters can achieve high efficiency and high power density, however, the switching behaviour leads to unwanted harmonics or ripple; such as unwanted high frequency components in current flowing into the converter. Preferably, one or more series-connected switch pairs can be found in a switching mode converter, even in basic buck or boost circuits.

Power devices are either in "ON state" or "OFF state" in most power electronic applications. For transistors, especially, the "ON state" refers to saturating the driving signal of a transistor over the threshold and such that the transistors conduct electrical current with minimum resistance or lowest voltage drop. The "OFF state" refers to withdraw the driving signal or anti-drive the transistor to maximise its resistance or voltage drop.

In another example embodiment, the functionality of a series-connected power device may be extended to be current-controllable. Preferably, at least one active semiconductor device may be included. Except for turning the current flowing through on or off, the transistor(s) may regulate current. The regulation may be implemented by dynamic programming at the control node of transistor for a linear operation.

Figure 3:
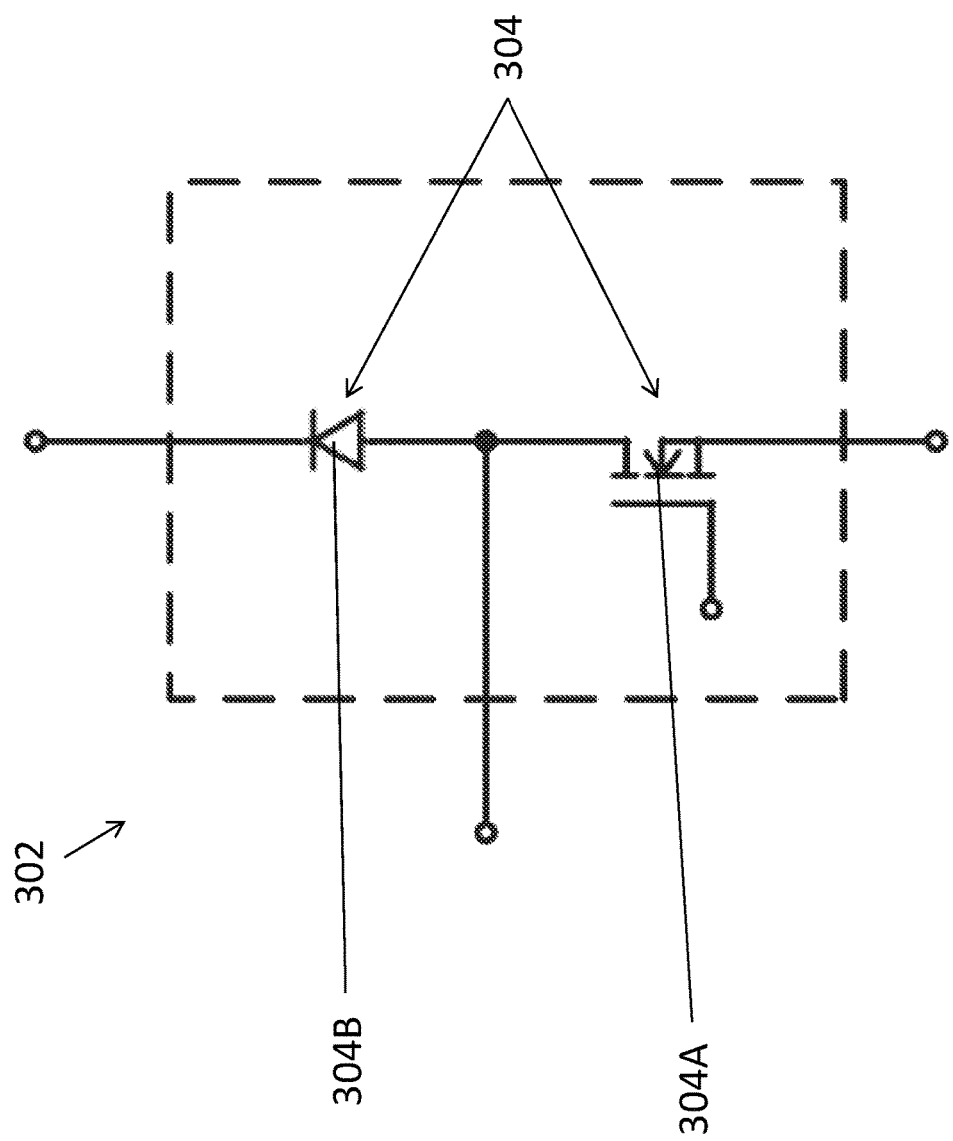
FIG. 3 is a schematic diagram of a circuit arrangement for use in a power conversion stage in accordance with an embodiment of the present invention.

With reference to FIG. 3, there is shown an embodiment of an circuit arrangement 302 for use in a power conversion stage, comprising at least two electronic devices 304 connected in series, the at least two electronic devices 304 includes at least one active power electronic device 304A operable in a plurality of operation states; wherein the at least one active power electronic device 304A is arranged to be controlled and to operate in the plurality of operation states in each of a plurality conversion cycles, such that a generation of electric harmonics in the power conversion stage is suppressed during an operation of the power conversion stage 302.

In this example, two electronic devices 304 are connected in series which defines a series-connected power semiconductor device 302, and includes at least one actively controlled transistor 304A. Preferably, the plurality of operation states includes an on state, an off state and an active state, thus except for "ON state" and "OFF state", the actively controlled transistor 304A may be continuously driven in active state, and may exhibit a resistive characteristic when operating in the active state. However, the transition period between on and off states should not be considered as an active state of the active power electronic device. On the other hand, the diode 304B in this series-connected power device is arranged to operate in a forward bias so as to conduct electric current therethrough.

Alternatively, the at least one active power electronic device 304A may be a MOSFET, a bipolar transistor, a thyristor, a TRIAC or any active electronic components or semiconductor devices which may be actively controlled such that it may operate in the abovementioned plurality of operation states.

Preferably, considering two series-connected transistor 304A, there may be nine possible combinations of modes for the series-connected power devices 302, shown in the table below, where "ON" stands for on state, "OFF" stands for off state, and "A" stands for active mode, which is supposed to control the current flowing through a controllable power device such as transistors.

|  | 1 | 2 | 3 | 4 | 5 | 6 | 7 | 8 | 9 |
|---|---|---|---|---|---|---|---|---|---|
| Device A | ON | ON | ON | OFF | OFF | OFF | A | A | A |
| Device B | ON | OFF | A | ON | OFF | A | ON | OFF | A |

Preferably, the at least one active power electronic device 304A may be further arranged to operate in either the on state or the active state during the operation of the power conversion stage. In some of the abovementioned operation modes with one of the two electronic device 304A operating in the OFF State, the other device 304A operating in the on state or the active state may still be conducting and current flows through only the ON/active device. On the other hand, mode 1 (both devices 304A in the on state) enables a saturation amount of current passing through the series-connected power device 302.

The series-connected power devices 302 may preferably operate in a controllable manner. With reference to the above table, modes 3, 6, 7, 8, 9 are valid with at least one controllable switch like transistor, especially, mode 9 is valid when both switches 304 are under current control. In these modes, one or both transistors 304 operate in the active state so as to limit the amount of current passing through the series-connected power devices 302. Preferably, a controller may be provided to control the at least one active power electronic device 304A to operate in the plurality of operation states.

In one example embodiment, a power conversion stage may include two or more series-connected power devices 302 connected in parallel manner (as shown in FIG. 2). In this example, the power conversion stage may be used as an electric current rectifier for converting an AC electric input from an AC power source to a DC electric output. The output of the power conversion stage or the rectifier may be further connected to additional conversion stages such as a switching network (e.g. a boost converter) or an electric load.

A controller may be included to precisely control the operation of the active power electronic device in accordance with the power conversion requirement.

Preferably, the controller may be a current feedback controller for an active power device so as to regulate an input current of the power conversion stage. For example, the at least one active power electronic device 304A may be controlled by the controller with a feedback mechanism associated with an input of the power conversion stage and/or the plurality of operation states of the at least one active power electronic device 304A, and the feedback mechanism may include an error amplifier arranged to detect an error signal in the power conversion stage (which corresponds to a difference between the input of the power conversion stage) and/or the plurality of operation states of the at least one active power electronic device 304A with respect to a referenced signal.

The controller may include a current sensor and a current reference connected to a first error amplifier. This error amplifier compares the sensed current of the device and the current reference to derive a first control signal, which dynamically drives the transistor 304 to adjust the current through it, so that the sensed current matches the reference.

Preferably, the controller is arranged to regulate the input voltage with reference to a voltage reference and the input voltage sensed by a voltage sensor. A voltage regulation may be implemented by a voltage feedback controller for an active power device. The controller has a voltage sensor and a voltage reference connected to a second error amplifier. This error amplifier may compare the sensed voltage across the transistor and the voltage reference to derive a second control signal, which tunes the operating point of the active switch 304A to adjust the voltage across it, so that the sensed voltage matches the reference. As a result, the controller may regulate a voltage drop on the active power electronic device with reference to a voltage reference and the voltage drop on the active power electronic device sensed by a voltage sensor.

It will be appreciated by a skilled person that each part in the controller may operate with certain frequency responses which may exist as component characteristics or be compensated intentionally.

In another example, the controller may be arranged to regulate the input current with reference to a current reference signal and the input current sensed by a current sensor. Thus, a transistor 304 may be controlled by a combined effect of both current and voltage controllers. Preferably, the controller is arranged to program a gate terminal of the transistor such that the transistor operates in the plurality of operation states.

Preferably, the driving signal at the control node (gate terminal) of the transistor may be a summation of the first control signal and the second control signal. The reference signal of both controllers may define the desired waveform of its concerned quantities. The reference signal can be predetermined in the circuit design or control program, such as a constant DC signal. The reference signal may also be time-variant. For example, the voltage controller may take the current controller output, which is the first control signal, as its reference signal.

In one embodiment of the invention, a transistor 304 may operate in active current control mode in a forward polarity and/or a reversed polarity, i.e. with current direction either from drain to source or source to drain. For example, current flowing through from source to drain of an N-channel MOSFET and drain to source of a P-channel MOSFET are considered as operating in a reversed polarity in MOSFET transistors. A MOSFET 304 may fully turn on, turn off or control current in single direction because of the body diode (PN junction between the substrate and well). In the other (reversed) direction current cannot be blocked or fully controlled, the transistor 304 may be controlled in a certain extent.

Figure 4:
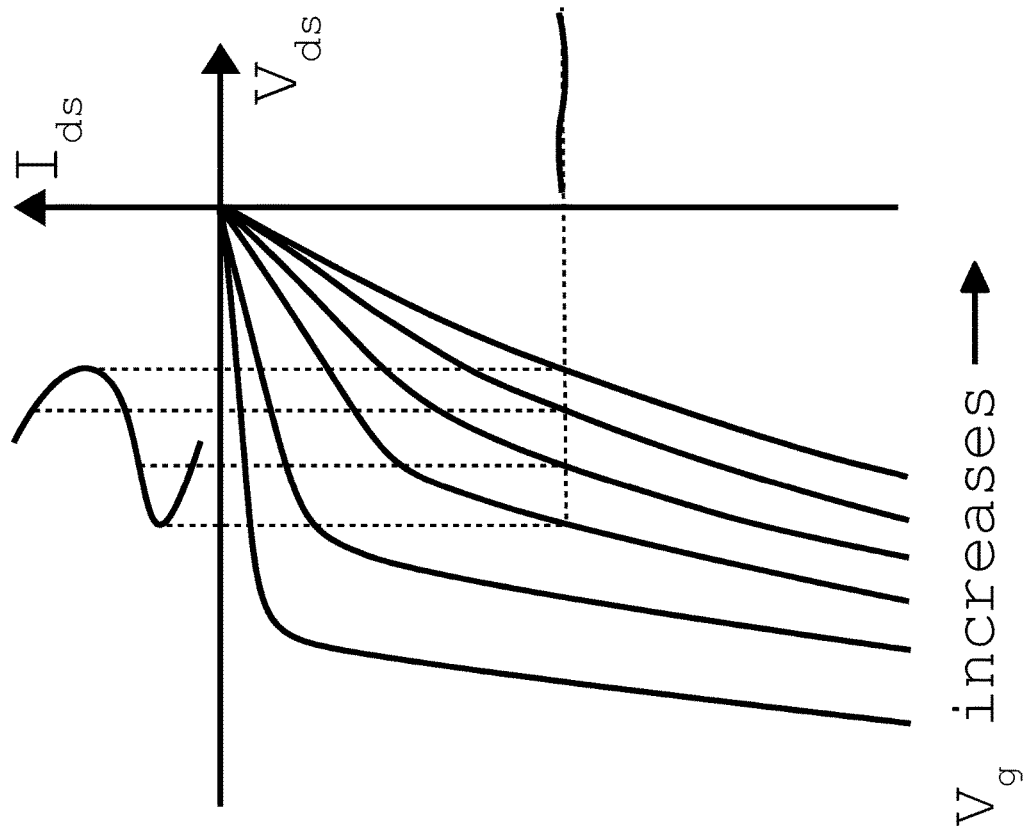
FIG. 4 is a plot showing an I-V characterisation of a transistor in the circuit arrangement of FIG. 3 operating in accordance with an embodiment of the present invention.

With reference to FIG. 4, there is shown a third-quadrant V-I characteristics of an N-channel enhancement mode MOSFET and the mechanism for current control for the reversed configuration. The direction from drain to source is defined to be positive. $V_g$ is the gate node voltage referring to the source. For each $V_g$ value, there is a corresponding V-I curve; with higher $V_g$ value the curve approaches closer to the $I_{ds}$-axis. The curves converge as $I_{ds}$ gets larger in negative direction; they finally merge into one curve, which exhibits characteristics of the body diode and loses the controllability.

Preferably, a controller may be used such that the transistor may operate in a controllable operating area as shown in FIG. 4. The instantaneous operating point may be made transiting from one curve to another thus being able to manipulate the current. FIG. 4 also illustrates a scenario of constant DC regulation, in which the dynamically controlled $V_g$ keeps the current substantially constant, resulting significantly varying voltage. Within the restricted operating area, where voltage and current are sufficiently small, characteristics of the MOSFET channel is dominant, which makes it controllable in negative direction.

Figure 5A:
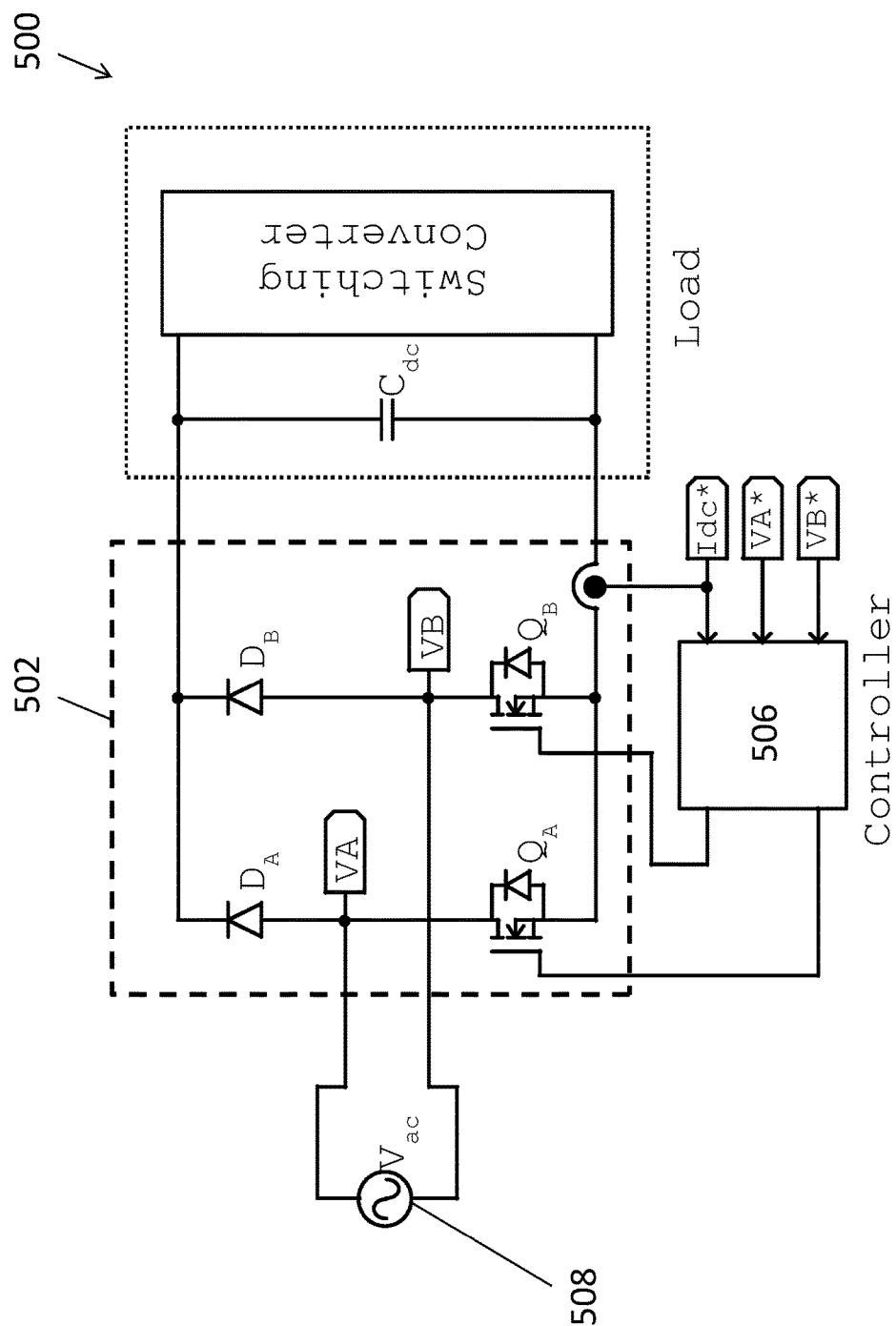
FIG. 5A is a schematic diagram of a power conversion stage including a circuit arrangement in accordance with an embodiment of the present invention.
Figure 5B:
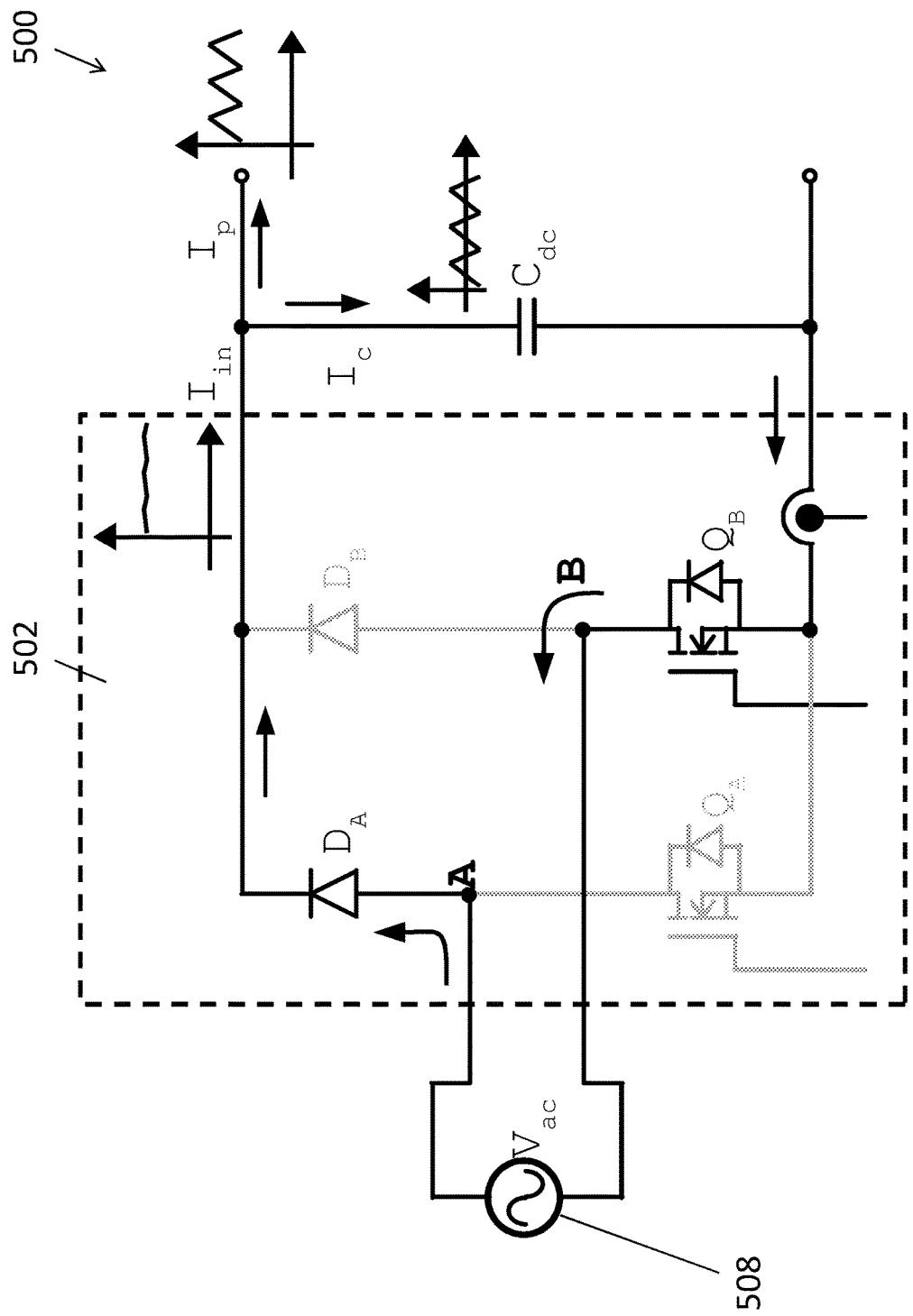
FIG. 5B is a schematic diagram of the power conversion stage of FIG. 5A, wherein the power conversion stage is operating in a positive half cycle.

In an example embodiment of the invention, the power conversion stage 500 includes a rectifier circuit arrangement 502. With reference to FIGS. 5A and 5B, an active full wave rectifier 502 can be built for an AC-DC switching converter 500. A full bridge 502, consisting of two diodes and two MOSFETs, may be made a direct replacement to a conventional diode bridge.

As discussed earlier, switching converters may induce unwanted high frequency harmonics getting into the input power grid or the AC power source. In conventional AC-DC switching converters, the rectifier is used merely as commutator. Extra filtering circuitry, such as line filters, may be included to handle the harmonics. Alternatively, the rectifier may attenuate harmonics itself in accordance with the embodiments of the present invention.

Referring to FIG. 5A, the active rectifier 502 may be implemented with two legs. Leg A is series-connected devices $D_A$ and $Q_A$; similarly, leg B is made of $D_B$ and $Q_B$. A controller 506 may be included, which may be associated with the rectifier 502 for controlling the commutation as well as the current filtering function. The rectifier 502 may be controlled with a program regarding polarity of the AC input 508 as shown below:

|  | $D_A$-$Q_A$ state | $D_B$-$Q_B$ state |
|---|---|---|
| Positive Half Cycle | ON-OFF | OFF-A |
| Negative Half Cycle | OFF-A | ON-OFF |

In the circuit arrangement 502, a MOSFET in OFF state blocks current. A MOSFET in active state is of high conductance close to ON state, as its dropout voltage is controlled to be low. The active state MOSFET controlled to reject unwanted high frequency current ripple, which is absorbed by capacitor $C_{dc}$. $C_{dc}$ is connected to the DC output of the rectifier 502. In applications like power factor correction, such capacitance is preferred to be adequately low to avoid degrading the power factor and current THD performance. It should be appreciated that the proposed rectifier does not require large $C_{dc}$ thus impact to the system is insignificant.

Referring to FIG. 5A, the power conversion stage may be connected to a boost converter operable as a DC-DC converter so as to convert the DC output from the rectifier circuit arrangement 502 to a suitable voltage level for use in a later conversion/loading stage connected thereto.

With reference to FIG. 5B, there is shown a positive half cycle operation of the rectifier 502. The negative half cycle operation is similar.

As the AC input 508 is slowly varying, so in sufficiently small time interval the regulated $I_{in}$ can be considered constant DC. Unwanted ripple from switching converter current $I_p$ is pushed into $C_{dc}$. It should be noted that every semiconductor device has unique characteristics; even for those of same design specification and batch. Since there is no current feedback, so any current regulation performance highly depends on device characteristics. The current error amplifier overcomes the device issue, by building a feedback control loop to regulate the current tightly.

Figure 6:
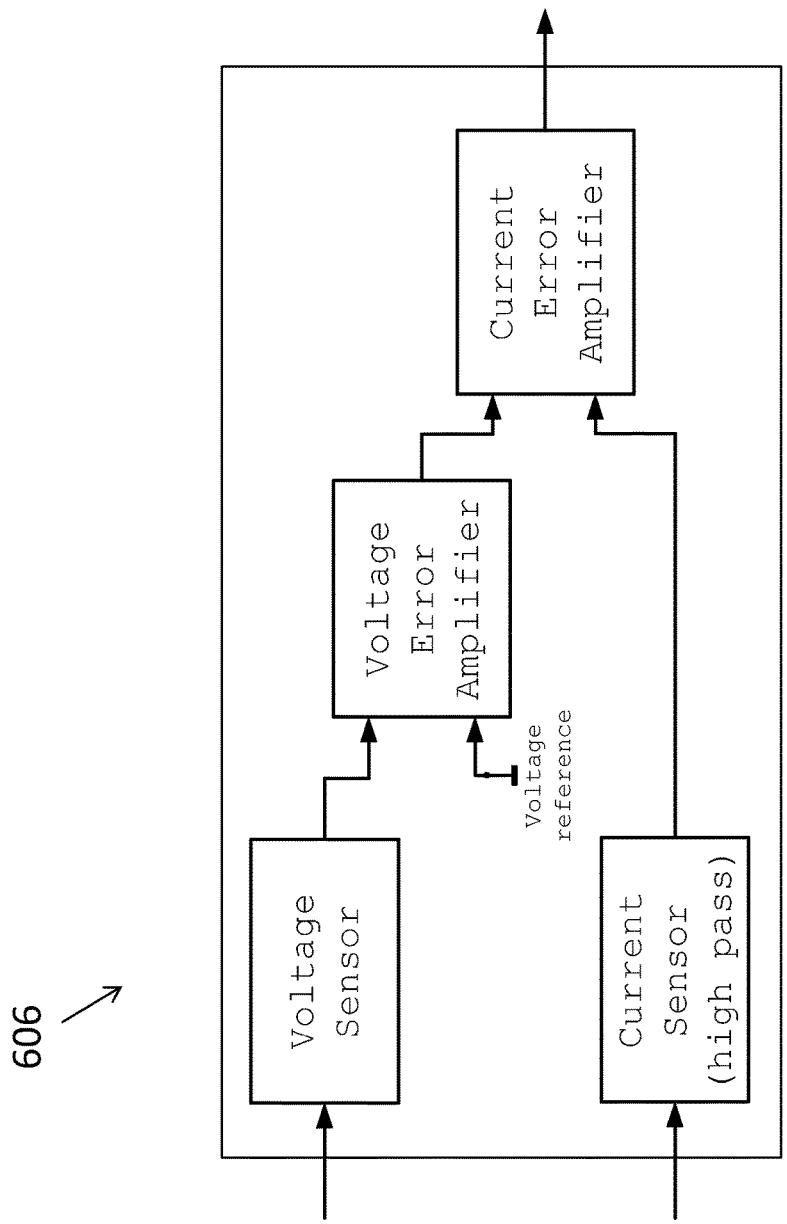
FIG. 6 is a block diagram of a controller of the circuit arrangement of FIG. 5A.

Preferably, the controller 506 is arranged to obtain the input current and/or the input voltage and to regulate the input current and/or the input voltage. The controller may include an analogue controller. With reference to FIG. 6, an analogue controller 606 may be included for the active rectifier with current filtering.

The current controller 506/606 may be designed to respond high-frequency current. It is nearly transparent to low-frequency AC like the 50/60 Hz fundamental component. On the contrary, the voltage controller regulates dropout of the MOSFET with low frequency response. When a MOSFET is to conduct, the dropout is used to define the operating area or biasing point, which is not supposed to escape into the uncontrollable area (where the body diode characteristic dominants). In this example, the dropout is controlled larger than zero but smaller than the body diode forward threshold. So the arrangement also keeps the conduction loss smaller than conventional diode rectifiers. As the grid voltage polarity changes, the voltage polarity on a MOSFET also changes. The voltage error amplifier thus has accumulating error at its input and turns the output down. In this way the MOSFET blocks.

Preferably, the current sensor may be a current transformer followed by a voltage follower, and the error amplifiers may include an operational amplifier with compensation network.

Figure 7:
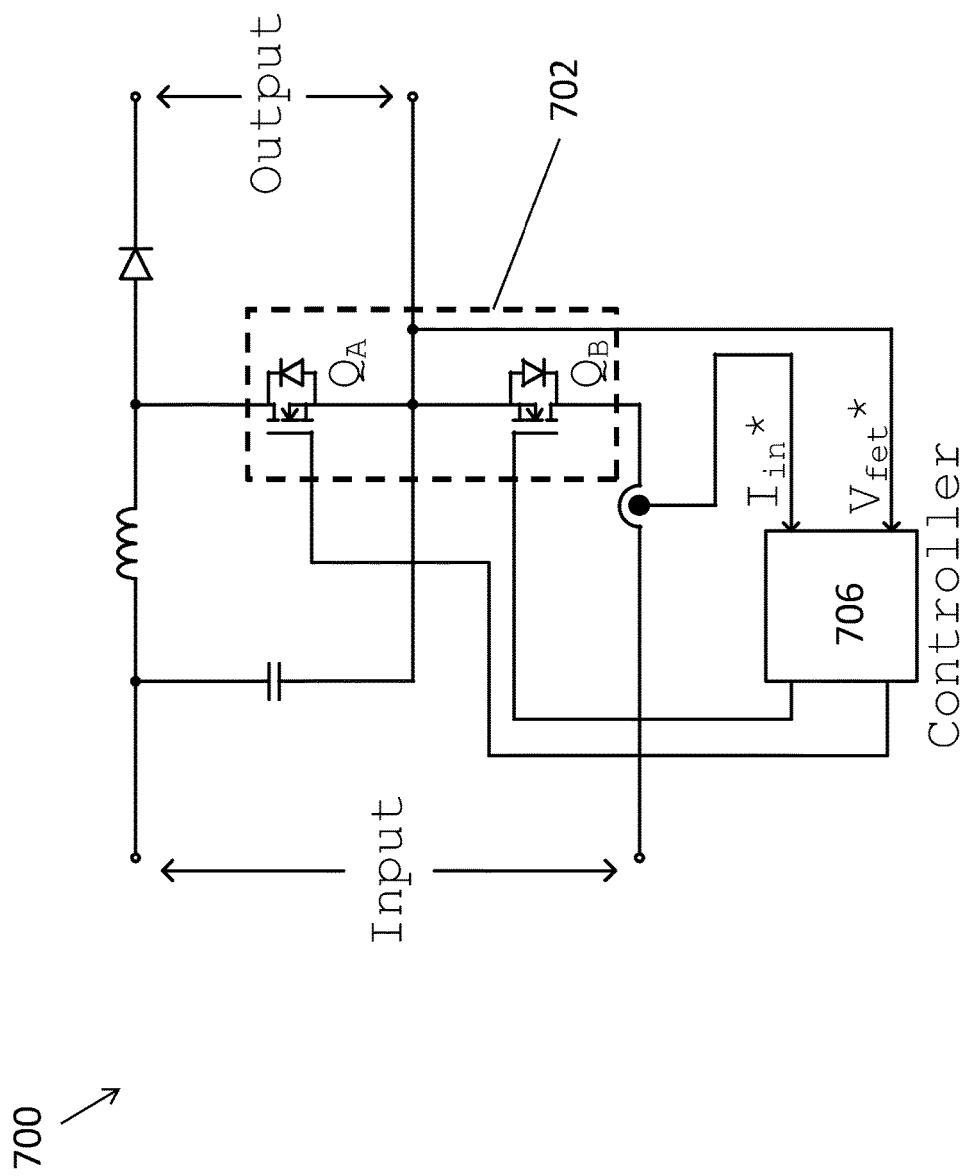
FIG. 7 is a schematic diagram of a power conversion stage including a circuit arrangement in accordance with an embodiment of the present invention.

With reference to FIG. 7, there is shown an example embodiment of the circuit arrangement 702 including the series-connected power devices with extended combination of modes may also be used in a boost converter 700.

In this embodiment, the combinations of states of $Q_A$ and $Q_B$ are:

|  | $Q_A$-$Q_B$ States |
|---|---|
| Inductor charging | ON-A |
| Inductor discharging | OFF-A |

The MOSFET $Q_A$ is controlled in ON/OFF mode by a controller 706 (such as a PWM controller), while $Q_B$ is in current control mode to filter the input current for the later stages. The control method for $Q_B$ is similar to that in active rectifier 502 described above. However, $Q_B$ is not necessarily designed to block current periodically as in a rectifier 502. Ripple current from the boost inductor is significantly rejected by $Q_B$.

Alternatively, the circuit arrangement may be used in a power conversion stage including a buck converter, a buck-boost converter or any switching converter.

These embodiments may be advantageous in that unwanted harmonics in power converters may be efficiently eliminated with active control of the switches or transistors. Therefore, bulky line filters are not necessary in a power conversion stage.

Advantageously, these embodiments of the circuit arrangement do not require additional controllers and sensors for active controls of the switches, and do not access those readily implemented in existing power conversion stage designs. In addition, parallel configurations as illustrated in FIG. 1B may also be used to increase the current handling capability of the series-connected power devices.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

It will also be appreciated that where the methods and systems of the present invention may be either wholly implemented by computing system or partly implemented by computing systems then any appropriate computing system architecture may be utilised. This will include standalone computers, network computers and dedicated hardware devices. Where the terms "computing system" and "computing device" are used, these terms are intended to cover any appropriate arrangement of computer hardware capable of implementing the function described.

Any reference to prior art contained herein is not to be taken as an admission that the information is common general knowledge, unless otherwise indicated.

The invention claimed is:

1. A circuit arrangement for use in a power conversion stage, comprising at least two power electronic devices connected in series, the at least two power electronic devices including at least one transistor operable in a plurality of operation states in which the transistor is arranged to operate in an current control mode in a forward polarity or a reversed polarity in response to a continuous dynamic control signal at a control node of the transistor; wherein the at least one-transistor is controlled to operate in one of the plurality of operation states in one of a plurality of time divisions in each of a plurality conversion cycles, such that electric harmonic distortions generated in the power conversion stage is suppressed during a propagation through the at least two power electronic devices; wherein the plurality of operation states include at least an active state in which the transistor is arranged to operate in the current control mode such that electrical current flowing through the transistor is dynamically controlled and the electrical current is regulated in an active region or a saturation region of the transistor, and the at least two power electronic devices connected in series conduct the regulated electrical current passing therethrough.

2. The circuit arrangement in accordance with claim 1, wherein the plurality of operation states includes an on state, in which the transistor conducts electrical current with minimum resistance, and an off state, in which the transistor restricts a conduction of electrical current with maximum resistance.

3. The circuit arrangement in accordance with claim 2, wherein the at least one transistor is further arranged to operate in either the on state or the active state during the operation of the power conversion stage.

4. The circuit arrangement in accordance with claim 1, further comprising a controller arranged to control the at least one transistor to operate in the plurality of operation states.

5. The circuit arrangement in accordance with claim 4, wherein the at least one transistor is arranged to be controlled by the controller with a feedback mechanism associated with an input of the power conversion stage.

6. The circuit arrangement in accordance with claim 5, wherein the feedback mechanism includes an error amplifier arranged to detect an error signal in the input of the power conversion stage and/or the plurality of operation states of the at least one transistor with respect to a referenced input.

7. The circuit arrangement in accordance with claim 5, wherein the controller is arranged to regulate an input current and/or an input voltage of the power conversion stage.

8. The circuit arrangement in accordance with claim 7, wherein the controller is arranged to regulate the input current with reference to a current reference and the input current sensed by a current sensor.

9. The circuit arrangement in accordance with claim 7, wherein the controller is arranged to regulate a voltage drop on the at least one transistor with reference to a voltage reference and the voltage drop on the at least one transistor sensed by a voltage sensor.

10. The circuit arrangement in accordance with claim 7, wherein the controller is arranged to obtain the input current and/or the input voltage and to regulate the input current and/or the input voltage.

11. The circuit arrangement in accordance with claim 4, wherein the control node includes a gate terminal of the transistor.

12. The circuit arrangement in accordance with claim 11, wherein the controller is arranged to program the gate terminal of the transistor such that the transistor operates in the plurality of operation states.

13. The circuit arrangement in accordance with claim 11, wherein the transistor is arranged to operate in the reversed polarity only.

14. The circuit arrangement in accordance with claim 1, wherein the power conversion stage includes a rectifier circuit arrangement.

15. The circuit arrangement in accordance with claim 1, wherein the power conversion stage is further arrange to operate with a boost converter connected thereto.

16. A method of controlling a power conversion stage, comprising the step of controlling a control node of at least one transistor to operate in one of a plurality of operation states in one of a plurality of time divisions in each of a plurality conversion cycles, such that electric harmonic distortions generated in the power conversion stage is suppressed during a propagation through the at least two power electronic devices; wherein the power conversion stage includes at least two power electronic devices connected in series and the at least two power electronic devices includes the at least one transistor; wherein the transistor is arranged to operate in an current control mode in a forward polarity or a reversed polarity in response to a continuous dynamic control signal at the control node of the transistor; and wherein the plurality of operation states include at least an active state in which the transistor is arranged to operate in the current control mode such that electrical current flowing through the transistor is dynamically controlled and the electrical current is regulated in an active region or a saturation region of the transistor, and the at least two power electronic devices connected in series conduct the regulated electrical current passing therethrough.

17. The method in accordance with claim 16, wherein the plurality of operation states includes an on state, in which the transistor conducts electrical current with minimum resistance, and an off state, in which the transistor restricts a conduction of electrical current with maximum resistance.

18. The method in accordance with claim 17, wherein the at least one transistor is further arranged to operate in either the on state or the active state during the operation of the power conversion stage.

19. The method in accordance with claim 16, further comprising the step of:
  detecting an error signal between an input of the power conversion stage with the at least one transistor with respect to a referenced input; and
  regulating an input current and/or a voltage drop of the at least one power electronic device of the power conversion stage based on the detected error signal.

20. The method in accordance with claim 16, wherein the control node includes a gate terminal of the transistor.

21. The method in accordance with claim 16, wherein the power conversion stage includes a rectifier circuit arrangement.

22. The method in accordance with claim 16, wherein the power conversion stage is arranged to operate with a boost converter connected thereto.

\* \* \* \* \*